United States Patent
Li et al.

(10) Patent No.: US 12,408,299 B2
(45) Date of Patent: Sep. 2, 2025

(54) IMMERSION COOLING SYSTEM AND ELECTRONIC APPARATUS HAVING THE SAME AND PRESSURE ADJUSTING MODULE

(71) Applicant: Wiwynn Corporation, New Taipei (TW)

(72) Inventors: Tsung-Han Li, New Taipei (TW); Chin-Han Chan, New Taipei (TW); Yi Cheng, New Taipei (TW); Ting-Yu Pai, New Taipei (TW)

(73) Assignee: Wiwynn Corporation, New Taipei (TW)

( * ) Notice: Subject to any disclaimer, the term of this patent is extended or adjusted under 35 U.S.C. 154(b) by 229 days.

(21) Appl. No.: 17/393,418

(22) Filed: Aug. 4, 2021

(65) Prior Publication Data

US 2022/0361358 A1  Nov. 10, 2022

(30) Foreign Application Priority Data

May 7, 2021  (TW) .................. 110116495

(51) Int. Cl.
*H05K 7/00* (2006.01)
*F28F 27/02* (2006.01)
(Continued)

(52) U.S. Cl.
CPC ............. *H05K 7/203* (2013.01); *F28F 27/02* (2013.01); *H05K 7/20* (2013.01); *H05K 7/20318* (2013.01);
(Continued)

(58) Field of Classification Search
CPC ...... H05K 7/203; H05K 7/20; H05K 7/20318; H05K 7/20327; H05K 7/20381; H05K 7/208; H05K 7/20236; F28F 27/02
See application file for complete search history.

(56) References Cited

U.S. PATENT DOCUMENTS

| 5,646,824 A | 7/1997 | Ohashi et al. |
| 9,844,166 B2 | 12/2017 | Shelnutt et al. |

(Continued)

FOREIGN PATENT DOCUMENTS

| CN | 105491849 | 4/2016 |
| CN | 105607715 | 7/2019 |

(Continued)

OTHER PUBLICATIONS

"Office Action of Taiwan Counterpart Application", issued on Aug. 2, 2022, p. 1-p. 19.

(Continued)

*Primary Examiner* — Travis Ruby
(74) *Attorney, Agent, or Firm* — JCIPRNET

(57) ABSTRACT

An immersion cooling system includes a box body, a condensing structure and a pressure adjusting module. The box body has a first containing space, the first containing space is adapted to contain a heat dissipation medium, and at least one heat generating component is disposed in the first containing space to be immersed in the heat dissipation medium which is in liquid state. The condensing structure is disposed in the first containing space and above the heat dissipation medium which is in liquid state. The pressure adjusting module is adapted to actively drive a fluid in the first containing space to flow into the second containing space, such that a pressure in the first containing space is reduced to be less than an external pressure. In addition, an electronic apparatus having the immersion cooling system and a pressure adjusting module are also provided.

6 Claims, 10 Drawing Sheets

(51) Int. Cl.
*H05K 7/20* (2006.01)
*G06F 1/20* (2006.01)

(52) U.S. Cl.
CPC ......... *H05K 7/20327* (2013.01); *H05K 7/208* (2013.01); *G06F 1/20* (2013.01)

(56) References Cited

U.S. PATENT DOCUMENTS

| | | | | |
|---|---|---|---|---|
| 10,966,349 | B1* | 3/2021 | Lau | H05K 7/20236 |
| 2008/0302115 | A1* | 12/2008 | Eknes | H05K 7/20236 |
| | | | | 62/183 |
| 2015/0060009 | A1* | 3/2015 | Shelnutt | H05K 7/20809 |
| | | | | 165/11.1 |
| 2017/0064862 | A1* | 3/2017 | Miyoshi | H01L 23/32 |
| 2017/0295670 | A1* | 10/2017 | Campbell | H05K 7/20236 |
| 2017/0325355 | A1* | 11/2017 | Lau | H05K 7/20381 |
| 2018/0020570 | A1* | 1/2018 | Fujiwara | H05K 7/20318 |
| 2018/0042138 | A1* | 2/2018 | Campbell | H05K 7/203 |
| 2018/0084670 | A1* | 3/2018 | Hirai | H05K 7/20272 |
| 2020/0158443 | A1* | 5/2020 | Tung | H05K 7/20327 |
| 2020/0211925 | A1* | 7/2020 | Sato | G03B 21/16 |
| 2020/0389997 | A1* | 12/2020 | Tung | H05K 7/203 |
| 2021/0120705 | A1* | 4/2021 | Enright | H05K 7/203 |
| 2021/0148643 | A1* | 5/2021 | Tung | F28D 15/02 |
| 2022/0159875 | A1* | 5/2022 | Tuma | H05K 7/203 |
| 2022/0159876 | A1* | 5/2022 | Tung | H05K 7/20381 |
| 2022/0256744 | A1* | 8/2022 | Le | H05K 7/20318 |
| 2022/0322577 | A1* | 10/2022 | Bauchart | B66D 3/04 |

FOREIGN PATENT DOCUMENTS

| | | |
|---|---|---|
| CN | 210840499 | 6/2020 |
| WO | 2007098477 | 8/2007 |
| WO | 2020170079 | 8/2020 |

OTHER PUBLICATIONS

"Office Action of China Counterpart Application", issued on Jun. 27, 2025, p. 1-p. 9.

* cited by examiner

IMMERSION COOLING SYSTEM AND ELECTRONIC APPARATUS HAVING THE SAME AND PRESSURE ADJUSTING MODULE

CROSS-REFERENCE TO RELATED APPLICATION

This application claims the priority benefit of Taiwan application serial no. 110116495, filed on May 7, 2021. The entirety of the above-mentioned patent application is hereby incorporated by reference herein and made a part of this specification.

BACKGROUND

Technical Field

The disclosure relates to a cooling system, an electronic apparatus having the same, and a pressure adjusting module; and particularly to, an immersion cooling system, an electronic apparatus having the same, and a pressure adjusting module.

Description of Related Art

As the performance of servers is rapidly enhanced, high-performance servers generate a lot of waste heat. To prevent a host from malfunctioning caused by the accumulation of waste heat, some servers are designed to immerse their motherboard in a liquid coolant. The liquid coolant absorbs the heat generated by the heating components of the motherboard and is gasified and condensed on a condensing pipeline. The heat dissipation droplets condensed on the pipeline fall back into the liquid coolant by gravity, and the process is in circulation to achieve the effect of heat dissipation, which is called two-phase immersion cooling technology in the industry. However, the price of the liquid coolant is usually expensive. If the pressure in the space used to contain the liquid coolant is relatively high, the gasified liquid coolant easily escapes to the outside environment, thereby increasing the maintenance cost of the servers.

SUMMARY

The disclosure provides an immersion cooling system capable of preventing a gaseous heat dissipation medium from escaping to the outside environment because of high pressure.

The disclosure provides an electronic apparatus having the immersion cooling system capable of preventing a gaseous heat dissipation medium from escaping to the outside environment because of high pressure.

The disclosure provides a pressure adjusting module adapted for the immersion cooling system.

In the disclosure, the immersion cooling system includes a box body, a condensing structure, and a pressure adjusting module. The box body includes a first containing space, the first containing space is adapted to contain a heat dissipation medium, and at least one heat generating component is disposed in the first containing space to be immersed in the heat dissipation medium which is in liquid state. The condensing structure is disposed in the first containing space and above the heat dissipation medium which is in a liquid state. The pressure adjusting module includes a second containing space, the second containing space interconnects with the first containing space, and the pressure adjusting module is adapted to actively drive a fluid in the first containing space to flow into the second containing space, such that a pressure in the first containing space is reduced to be less than an external pressure.

In the disclosure, the electronic apparatus includes at least one heat generating component and an immersion cooling system. The immersion cooling system includes a box body, a condensing structure, and a pressure adjusting module. The box body includes a first containing space, the first containing space is adapted to contain a heat dissipation medium, and the heat generating component is disposed in the first containing space to be immersed in the heat dissipation medium which is in liquid state. The condensing structure is disposed in the first containing space and above the heat dissipation medium which is in a liquid state. The pressure adjusting module includes a second containing space, the second containing space interconnects with the first containing space, and the pressure adjusting module is adapted to actively drive a fluid in the first containing space to flow into the second containing space, such that a pressure in the first containing space is reduced to be less than an external pressure.

In an embodiment of the disclosure, the pressure adjusting module is adapted to actively drive the fluid in the second containing space to flow into the first containing space.

In an embodiment of the disclosure, the fluid is gas in the first containing space.

In an embodiment of the disclosure, the fluid is the heat dissipation medium which is in liquid state in the first containing space.

In an embodiment of the disclosure, the pressure adjusting module includes a bellows structure and a driving unit, the second containing space is an expandable and contractible space of the bellows structure, and the driving unit is adapted to drive the expandable and contractible space to expand and drive gas in the first containing space to flow into the expandable and contractible space.

In an embodiment of the disclosure, the driving unit is adapted to drive the expandable and contractible space to contract and drive gas in the second containing space to flow into the first containing space.

In an embodiment of the disclosure, the second containing space is disposed under the first containing space, the pressure adjusting module includes a valve, the valve is disposed between the first containing space and the second containing space, and the valve is adapted to be turned on, so that the heat dissipation medium which is in liquid state in the first containing space flows into the second containing space.

In an embodiment of the disclosure, the pressure adjusting module includes a pipeline and a pump, the pipeline is connected between the first containing space and the second containing space, and the pump is disposed on a flow path of the pipeline and adapted to drive the heat dissipation medium which is in liquid state in the second containing space to flow into the first containing space.

In an embodiment of the disclosure, the pressure adjusting module includes a pipeline and a driving unit, the pipeline is connected between the first containing space and the second containing space, and the driving unit is disposed in the pipeline and adapted to drive gas in the first containing space to flow into the second containing space through the pipeline.

In an embodiment of the disclosure, the driving unit is adapted to drive gas in the second containing space to flow into the first containing space through the pipeline.

In the disclosure, the pressure adjusting module is adapted for a heat dissipation medium in a first containing space of an immersion cooling system and includes a driving unit and a second containing space, the second containing space interconnects with the first containing space of the immersion cooling system, and the driving unit drives the heat dissipation medium in the first containing space to flow into the second containing space.

In an embodiment of the disclosure, the pressure adjusting module is adapted to actively drive the fluid in the second containing space to flow into the first containing space.

In an embodiment of the disclosure, the fluid is gas in the first containing space.

In an embodiment of the disclosure, the fluid is the heat dissipation medium which is in liquid state in the first containing space.

In an embodiment of the disclosure, the pressure adjusting module includes a bellows structure, the second containing space is an expandable and contractible space of the bellows structure, and the driving unit is adapted to drive the expandable and contractible space to expand and drive gas in the first containing space to flow into the expandable and contractible space.

In an embodiment of the disclosure, the driving unit is adapted to drive the expandable and contractible space to contract and drive gas in the second containing space to flow into the first containing space.

In an embodiment of the disclosure, the second containing space is disposed under the first containing space, the pressure adjusting module includes a valve, the valve is disposed between the first containing space and the second containing space, and the valve is adapted to be turned on, so that the heat dissipation medium which is in liquid state in the first containing space flows into the second containing space.

In an embodiment of the disclosure, the pressure adjusting module includes a pipeline and a pump, the pipeline is connected between the first containing space and the second containing space, and the pump is disposed on a flow path of the pipeline and adapted to drive the heat dissipation medium which is in liquid state in the second containing space to flow into the first containing space.

In an embodiment of the disclosure, the pressure adjusting module includes a pipeline, the pipeline is connected between the first containing space and the second containing space, and the driving unit is disposed in the pipeline and adapted to drive gas in the first containing space to flow into the second containing space through the pipeline.

In an embodiment of the disclosure, the driving unit is adapted to drive gas in the second containing space to flow into the first containing space through the pipeline.

DESCRIPTION OF THE EMBODIMENTS

Figure 1:
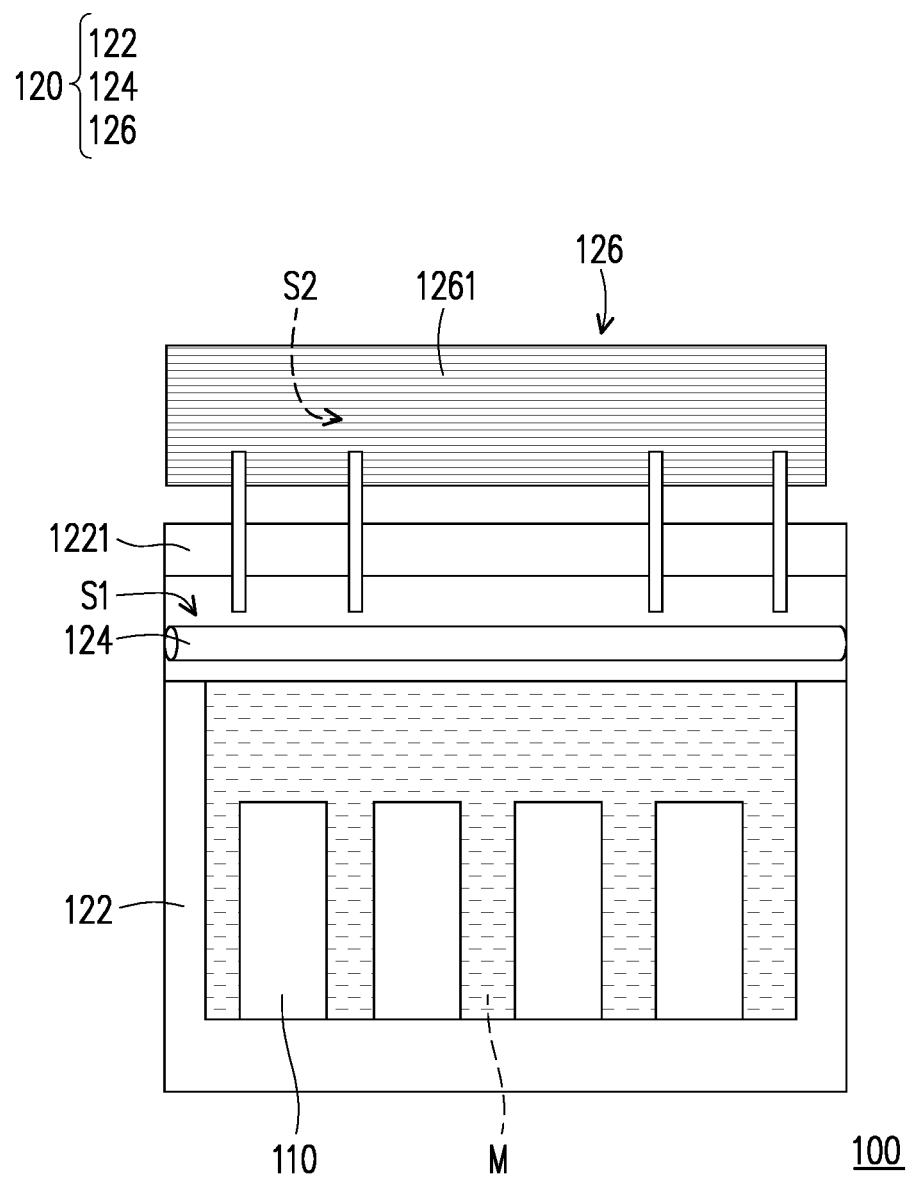
FIG. 1 is a front schematic view of an electronic apparatus according to an embodiment of the disclosure.
Figure 2:
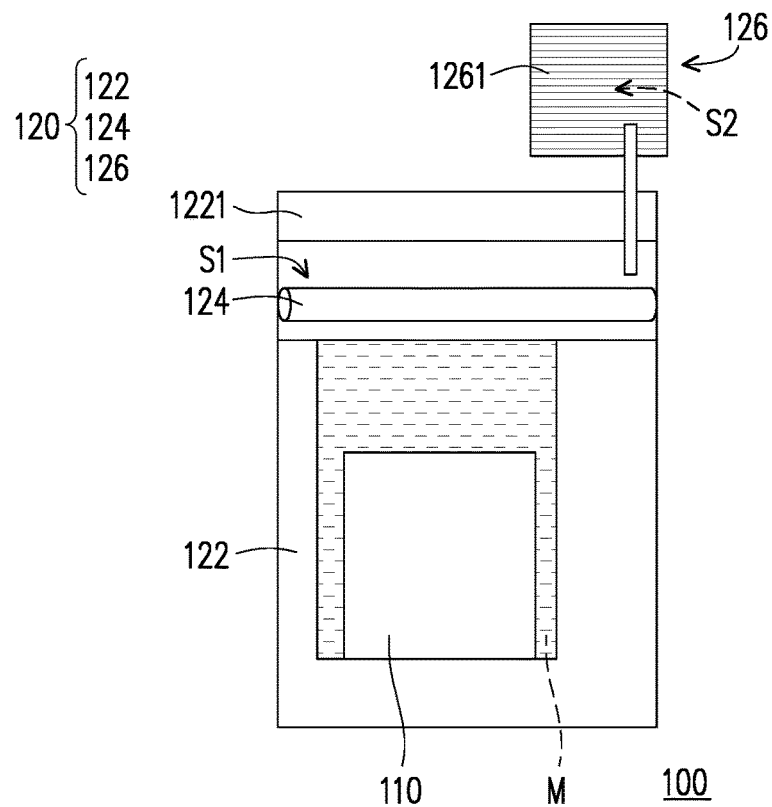
FIG. 2 is a side schematic view of the electronic apparatus in FIG. 1.
Figure 3:
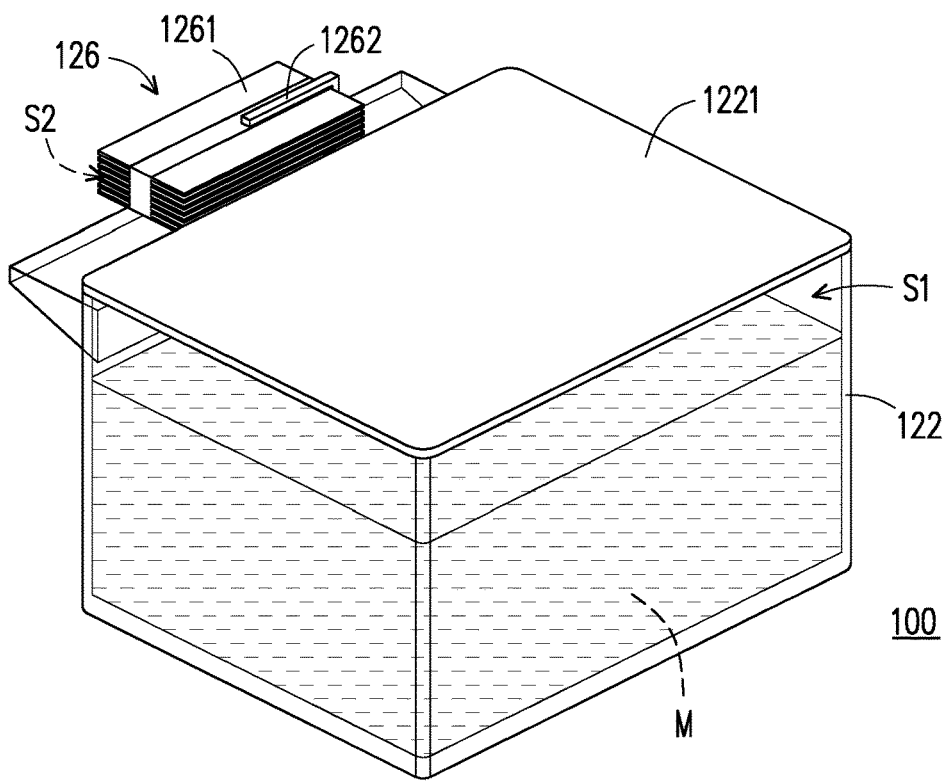
FIG. 3 is a perspective view illustrating part of components of the electronic apparatus in FIG. 1.

FIG. 1 is a front schematic view of an electronic apparatus according to an embodiment of the disclosure. FIG. 2 is a side schematic view of the electronic apparatus in FIG. 1. FIG. 3 is a perspective view illustrating part of components of the electronic apparatus in FIG. 1. Referring to FIG. 1 to FIG. 3, in the embodiment, an electronic apparatus 100 is a server and includes multiple heat generating components 110 and an immersion cooling system 120, for example. The immersion cooling system 120 includes a box body 122 and a condensing structure 124. The box body 122 includes a first containing space S1, and the first containing space S1 is adapted to contain a heat dissipation medium M. For example, the heat generating component 110 is a motherboard and disposed in the first containing space S1 to be immersed in the heat dissipation medium M which is in liquid state. The condensing structure 124 is disposed above the heat dissipation medium M which is in liquid state in the first containing space S1.

For example, at room temperature, the heat dissipation medium M is a dielectric liquid in liquid state and may be a fluorinated liquid having a boiling point of 40° C. to 60° C. or other suitable heat dissipation medium, for example, but the disclosure is not limited thereto. The liquid heat dissipation medium M may absorb the heat generated by the heat generating component 110 to reduce the temperature of the heat generating component 110 and is boiled and gasified rapidly through the heat generated by the heat generating component 110. When a gaseous heat dissipation medium M having high thermal energy in the sealed first containing space S1 flows to the condensing structure 124, it is cooled by the low-temperature condensate flowing in the condensing structure 124 and condensed on the condensing structure 124. The condensate in the condensing structure 124 absorbs the thermal energy from the heat dissipation medium M and then flows to the outside of the electronic apparatus 100 for heat exchange to be cooled, the cooled condensate flows back to the condensing structure 124, and the process is in circulation. On the other hand, the droplets of the heat dissipation medium M condensed on the condensing structure 124 fall back into the liquid heat dissipation medium M through gravity, and the process is in circulation to achieve the heat dissipation effect. A cover body 1221 of the box body 122 is adapted to cover the box body 122 to seal the first containing space S1 of the box body 122, so that the heat dissipation medium M performs the circulation in the sealed first containing space S1. Moreover, the cover body 1221 may be opened relative to the box body 122 to expose the first containing space S1 of the box body 122 to the outside environment, so as to facilitate maintenance of the electronic apparatus 100 or removal or replacement of components.

The immersion cooling system 120 further includes a pressure adjusting module 126. The pressure adjusting module 126 includes a second containing space S2, and the second containing space S2 interconnects with the first containing space S1. The pressure adjusting module 126 is adapted to actively drive a fluid in the first containing space S1 to flow to the second containing space S2, and the pressure in the first containing space S1 is reduced and even turns to be in a negative pressure state. Accordingly, the gaseous heat dissipation medium M in the box body 122 is prevented from escaping to the outside environment because of high pressure. Moreover, the pressure adjusting module 126 is also adapted to actively drive the fluid in the second containing space S2 to flow into the first containing space S1, and it is prevented that the cover body 1221 is difficult to be opened because of the negative pressure.

Figure 4:
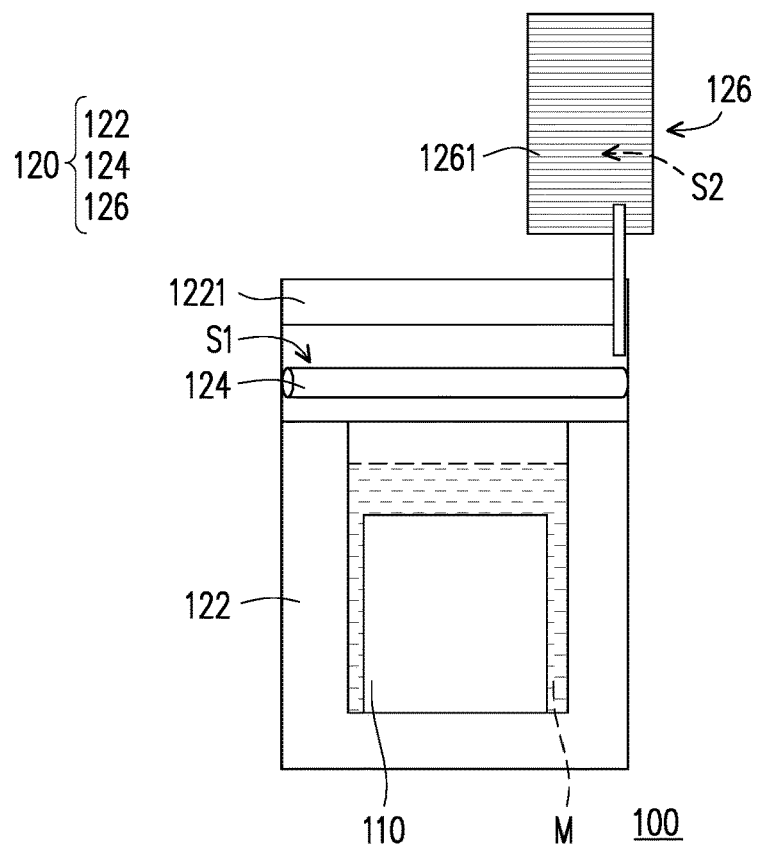
FIG. 4 illustrates the operation of a pressure adjusting module in FIG. 2.
Figure 5:
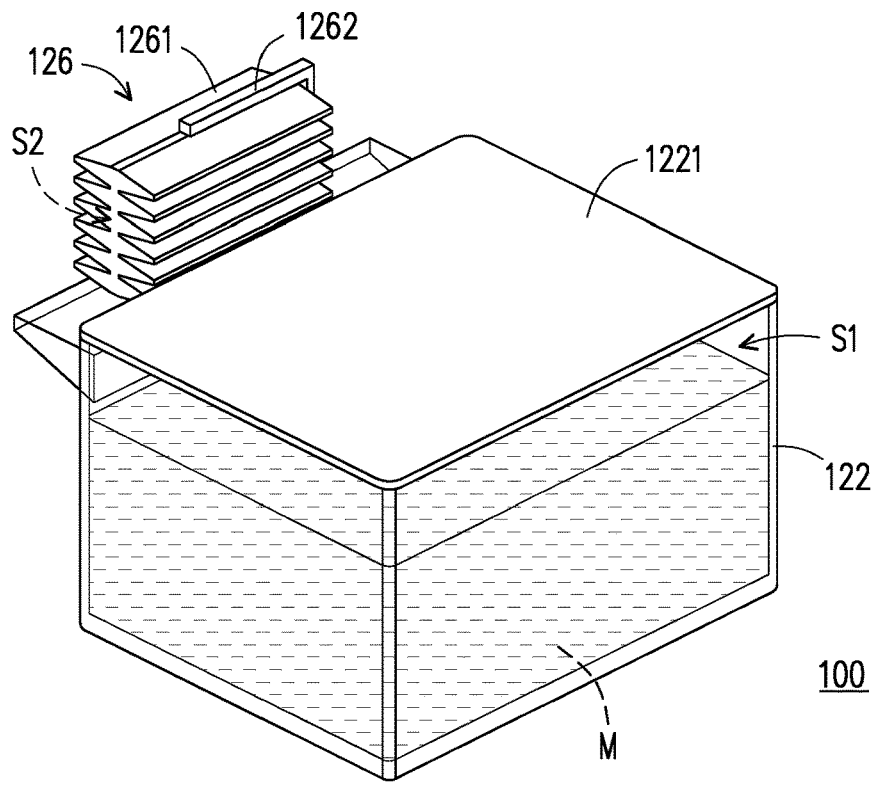
FIG. 5 illustrates the operation of a pressure adjusting module in FIG. 3.

In the embodiment, for example, the fluid driven by the pressure adjusting module 126 is gas in the first containing space S1, and the fluid may include air and gaseous heat dissipation medium M. FIG.4 illustrates the operation of a pressure adjusting module in FIG. 2. FIG.5 illustrates the operation of a pressure adjusting module in FIG. 3. Specifically, in the embodiment, the pressure adjusting module 126 includes a bellows structure 1261 and a driving unit 1262. The second containing space S2 is an expandable and contractible space in the bellows structure 1261. The driving unit 1262 is adapted to drive the expandable and contractible space (the second containing space S2) of the bellows structure 1261 to expand as shown in FIG. 4 and FIG. 5, so that gas in the first containing space S1 is driven to flow into the expandable and contractible space (the second containing space S2).

For example, the electronic apparatus 100 includes a controller. The controller controls the driving unit 1262 to drive the bellows structure 1261 according to the pressure in the first containing space S1, so a preset negative pressure state is maintained in the first containing space S1. Moreover, the controller can control the driving unit 1262 to drive the expandable and contractible space (the second containing space S2) to contract as shown in FIG. 1 to FIG. 3, and gas in the expandable and contractible space (the second containing space S2) is driven to flow into the first containing space S1. The driving unit 1262 can be implemented by a driving component, such as a motor or a cylinder, and the actual form of the driving component in the disclosure is not limited thereto.

Figure 6:
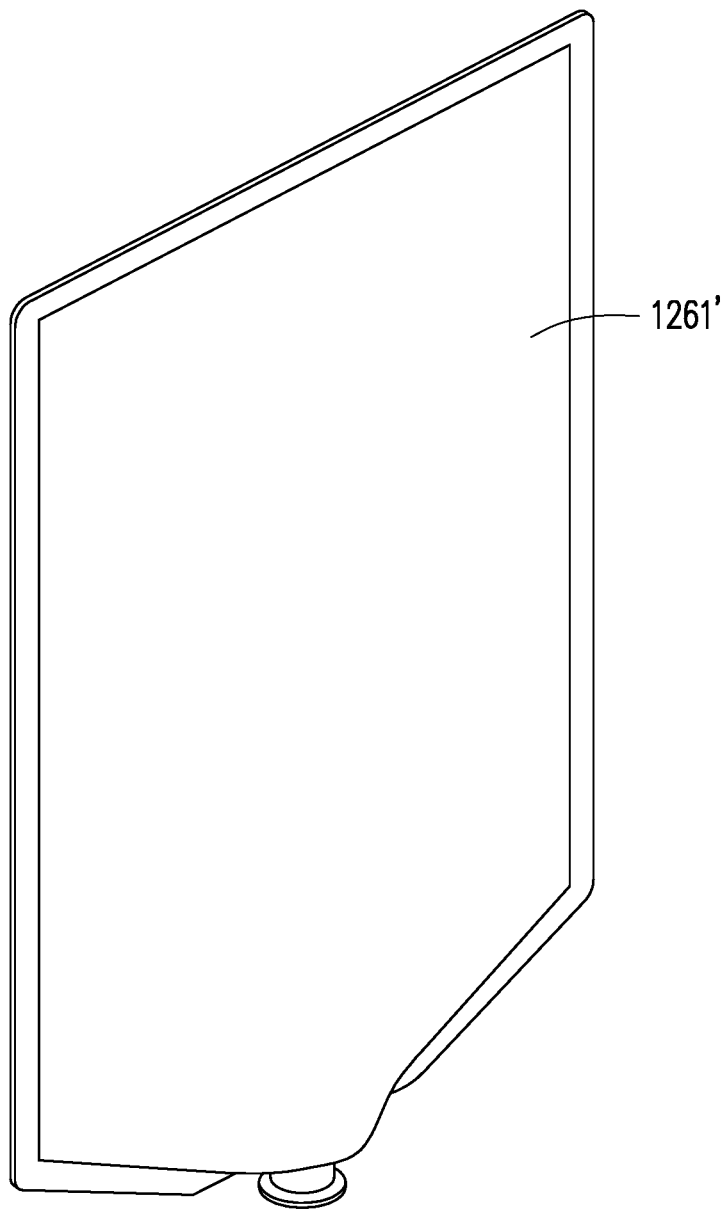
FIG. 6 is a perspective view of a bellows structure according to another embodiment of the disclosure.

Moreover, in the disclosure, the form of the bellows structure is not limited. FIG. 6 is a perspective view of a bellows structure according to another embodiment of the disclosure. The bellows structure 1261 shown in FIG. 3 can be replaced by a different form of a bellows structure 1261' shown in FIG. 6, or by other different forms.

Figure 7:
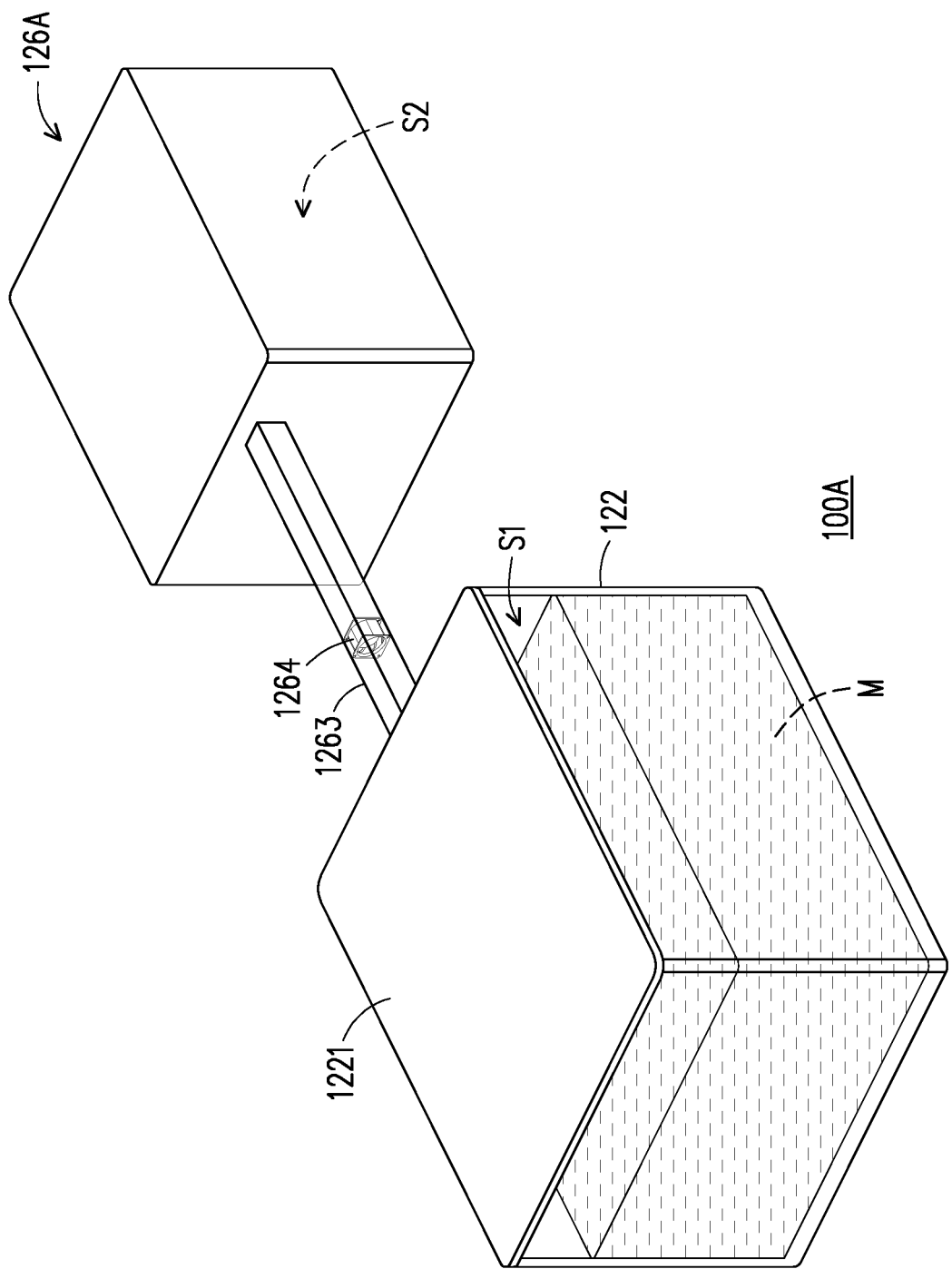
FIG. 7 is a perspective view illustrating part of components of an electronic apparatus according to another embodiment of the disclosure.
Figure 8:
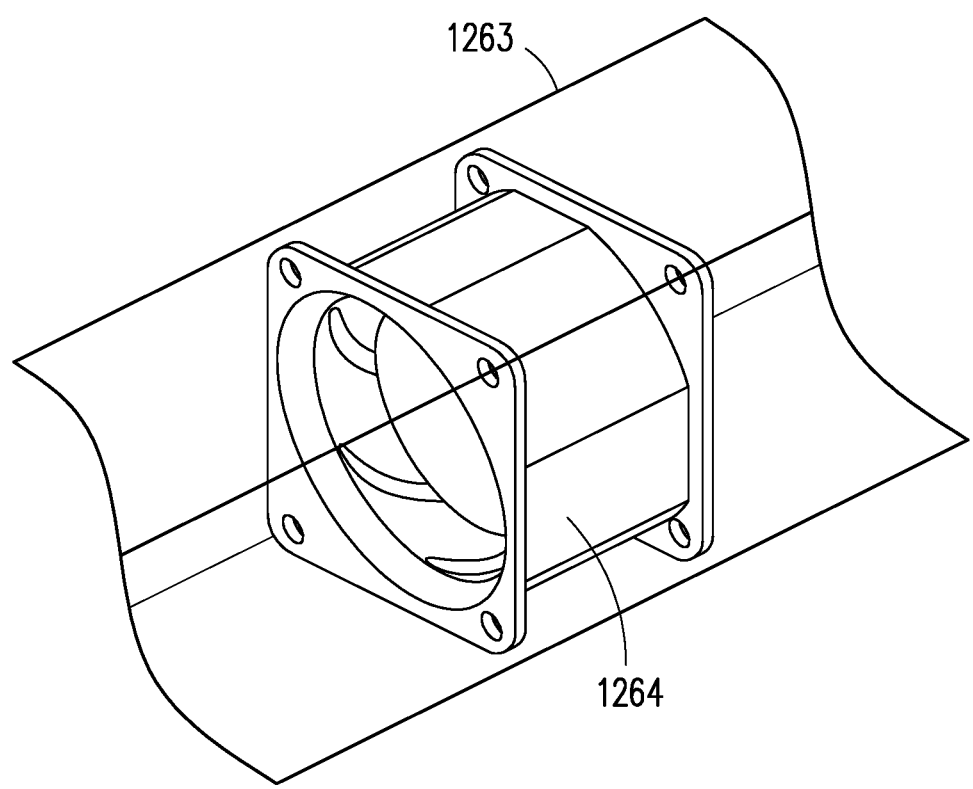
FIG. 8 is an enlarged view of part of the electronic apparatus in FIG. 7.

FIG. 7 is a perspective view illustrating part of components of an electronic apparatus according to another embodiment of the disclosure. FIG. 8 is an enlarged view of part of the electronic apparatus in FIG. 7. The difference between an electronic apparatus 100A in FIG. 7 and the electronic apparatus 100 in FIG. 3 is that in FIG. 7, a pressure adjusting module 126A includes a pipeline 1263 and a driving unit 1264. The pipeline 1263 is connected between the first containing space S1 and the second containing space S2. For example, the driving unit 1264 is a fan and disposed in the pipeline 1263. The driving unit 1264 is adapted to drive gas in the first containing space S1 to flow into the second containing space S2 through the pipeline 1263. The electronic apparatus 100A includes a controller, for example. The controller controls the driving unit 1264 according to the pressure in the first containing space S1, so a preset negative pressure state is maintained in the first containing space S1. Moreover, the controller can control the driving unit 1264 to drive gas in the second containing space S2 to flow into the first containing space S1 through the pipeline 1263. The driving unit 1264 may be an airflow generating component, such as a fan. In the disclosure, the actual form of the airflow generating component is not limited.

Figure 9:
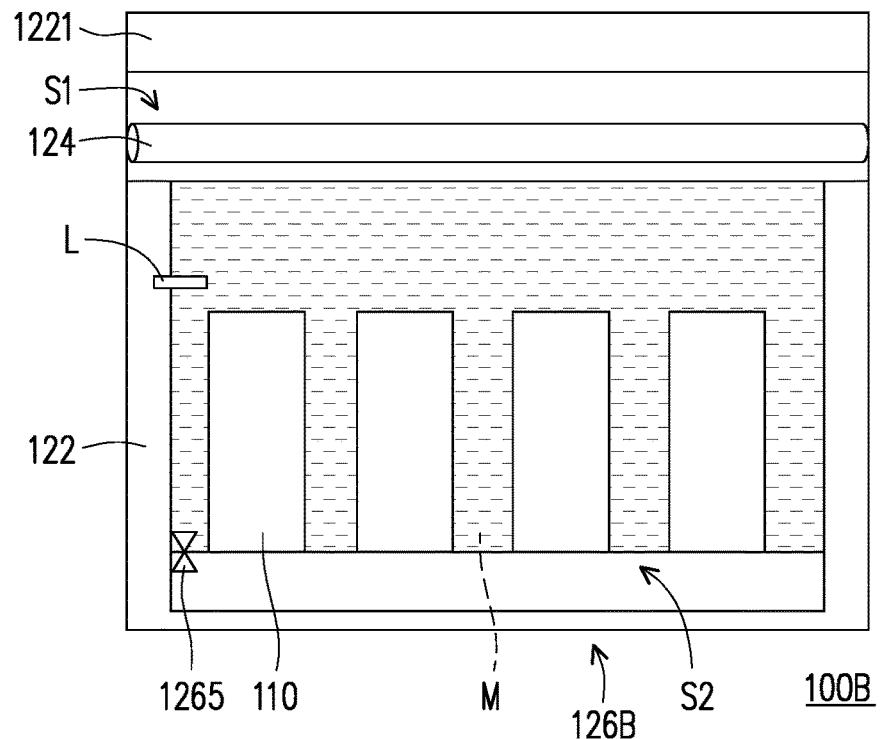
FIG. 9 is a front schematic view of an electronic apparatus according to another embodiment of the disclosure.
Figure 10:
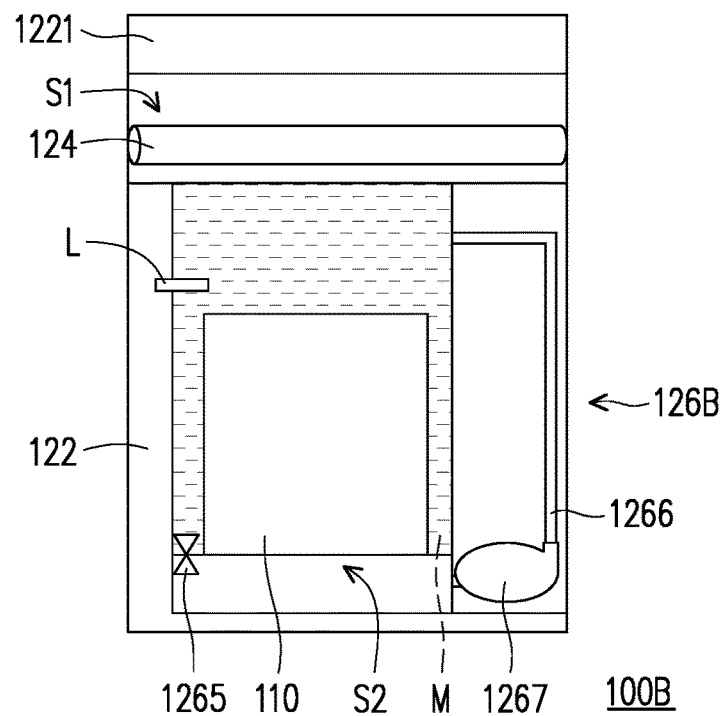
FIG. 10 is a side schematic view of the electronic apparatus in FIG. 9.
Figure 11:
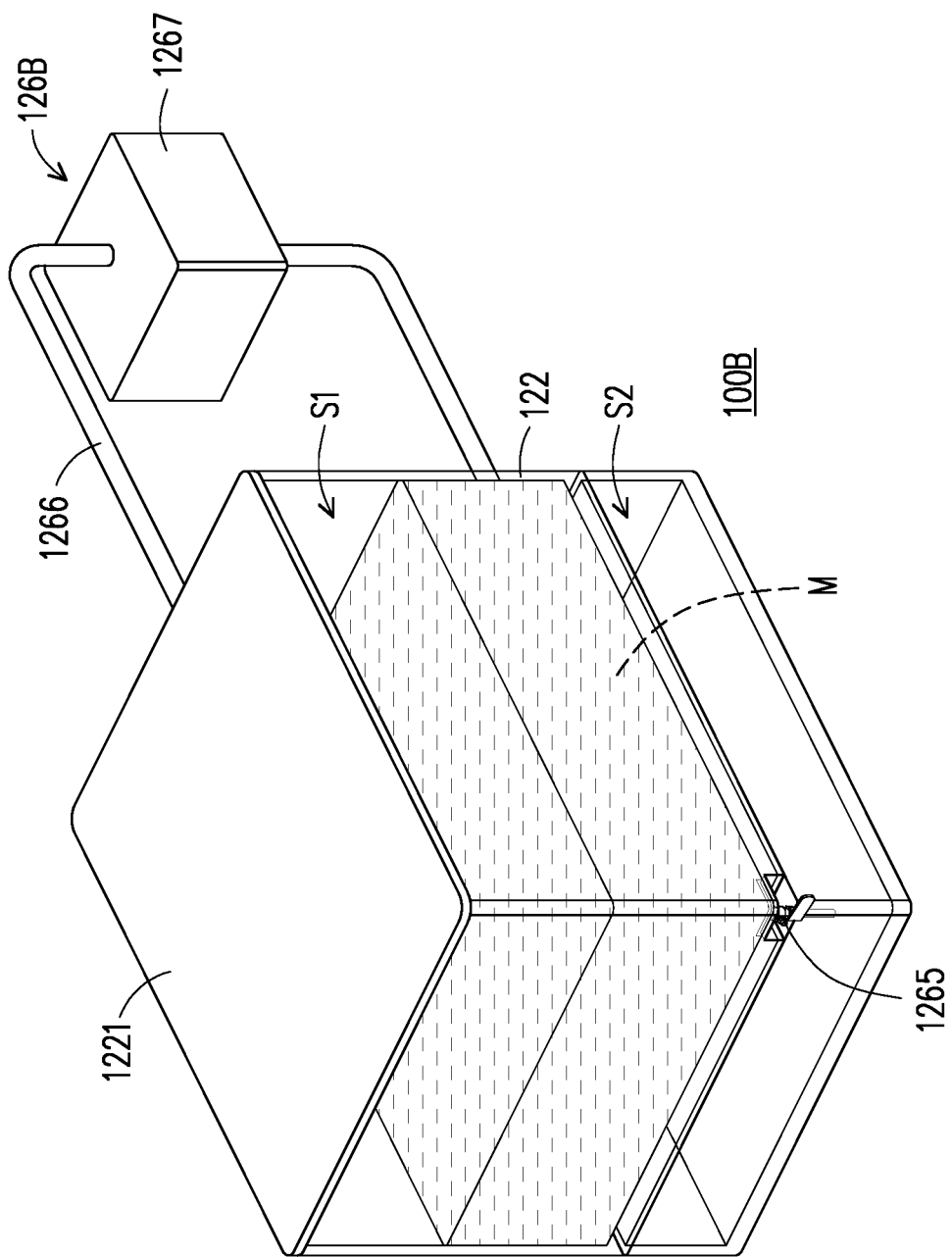
FIG. 11 is a perspective view illustrating part of components of the electronic apparatus in FIG. 9.
Figure 12:
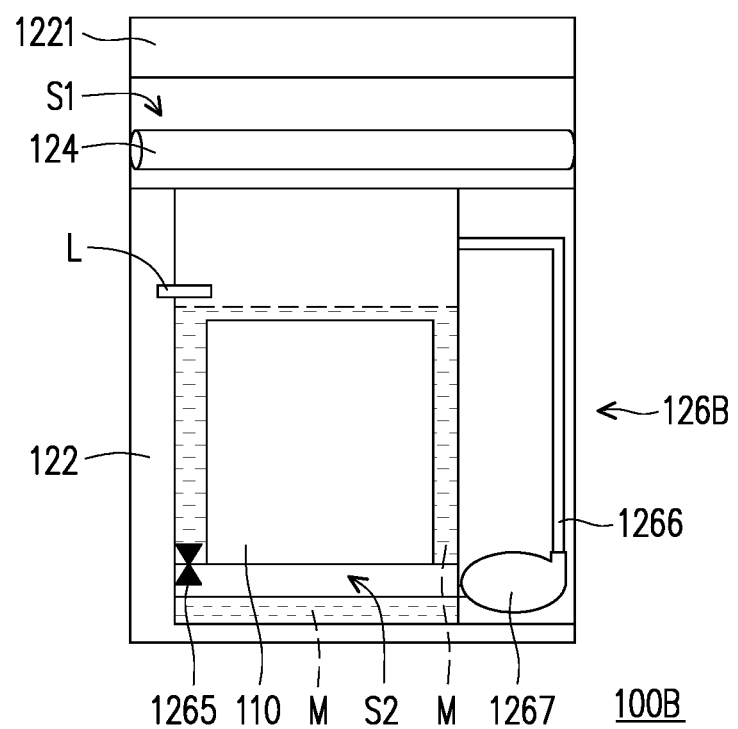
FIG. 12 illustrates the operation of a pressure adjusting module in FIG. 9.
Figure 13:
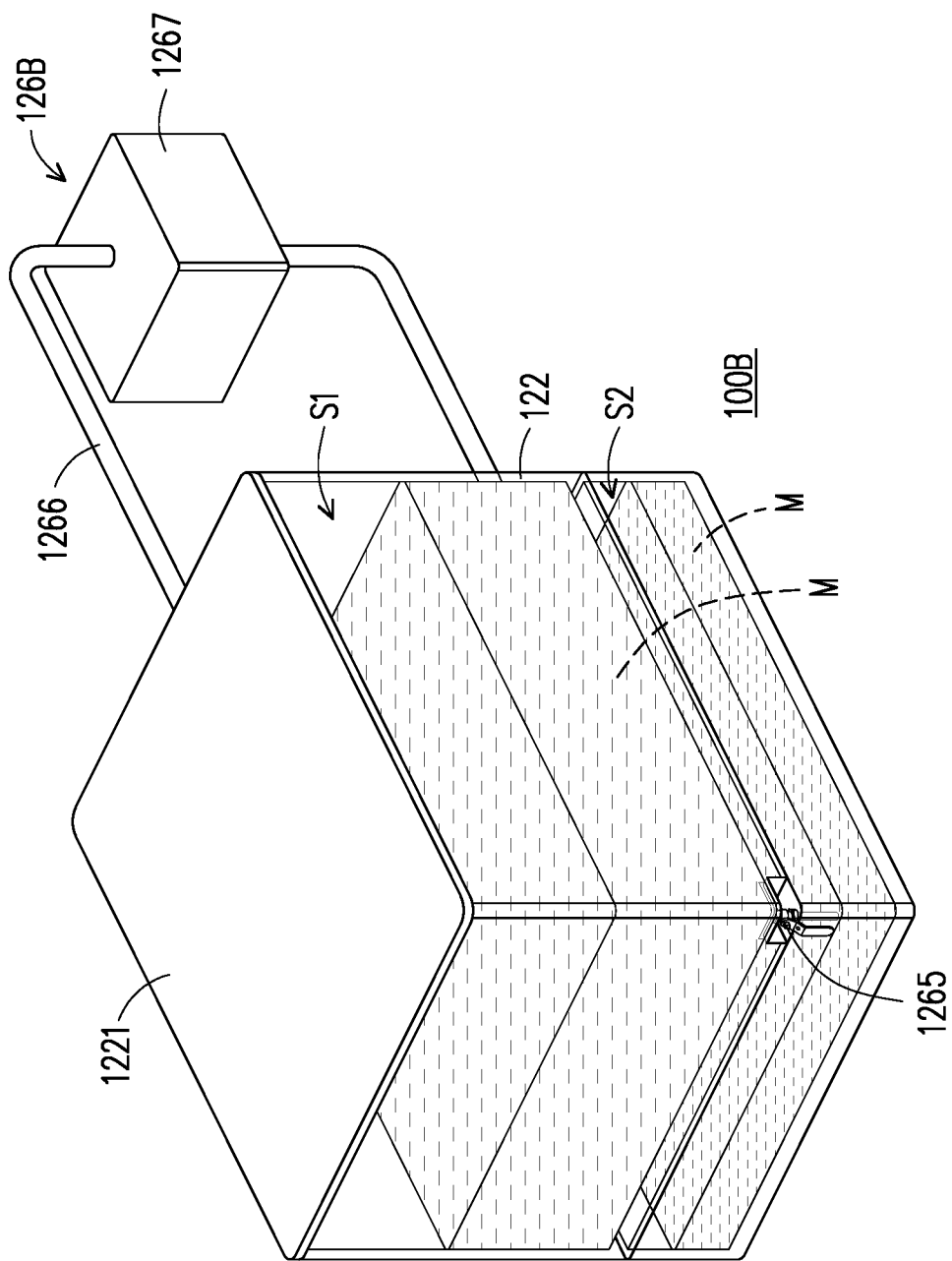
FIG. 13 illustrates the operation of a pressure adjusting module in FIG. 11.

FIG.9 is a front schematic view of an electronic apparatus according to another embodiment of the disclosure. FIG.10 is a side schematic view of the electronic apparatus in FIG. 9. FIG.11 is a perspective view illustrating part of components of the electronic apparatus in FIG.9. FIG.12 illustrates the operation of a pressure adjusting module in FIG.9. FIG.13 illustrates the operation of a pressure adjusting module in FIG.11. The difference between an electronic apparatus 100B in FIG.9 to FIG. 13 and the electronic apparatus 100 in FIG.1 to FIG.5 is that in the electronic apparatus 100B, the fluid driven by the pressure adjusting module 126B is the liquid heat dissipation medium M in the first containing space S1, for example.

Specifically, in the electronic apparatus 100B, the second containing space S2 is disposed under the first containing space S1. The pressure adjusting module 126B includes a valve 1265. For example, the valve 1265 is an electromagnetic valve and disposed between the first containing space S1 and the second containing space S2. The valve 1265 is adapted to be turned on, so that the liquid heat dissipation medium M in the first containing space S1 shown in FIG. 12 and FIG. 13 flows into the second containing space S2. By decreasing the volume of the liquid heat dissipation medium M in the first containing space S1, the volume of the gas in the first containing space S1 increases to reduce the pressure of the gas. For example, the electronic apparatus 100B includes a controller. The controller controls the valve 1265 to be turned on according to the pressure in the first containing space S1, so a preset negative pressure state is maintained in the first containing space S1.

Moreover, the pressure adjusting module 126B further includes a pipeline 1266 and a pump 1267. The pipeline 1266 is connected between the first containing space S1 and the second containing space S2. The pump 1267 is disposed on a flow path of the pipeline 1266 and adapted to drive the liquid heat dissipation medium M in the second containing space S2 to flow into the first containing space S1. The controller can control the valve 1265 and the pump 1267 according to a liquid level sensed by a level gauge L to maintain a preset liquid level of the heat dissipation medium M.

In other embodiments, at least any two or all three of the pressure adjusting module 126 shown in FIG. 1 to FIG. 5, the pressure adjusting module 126A shown in FIG. 7, and the pressure adjusting module 126B shown in FIG. 9 to FIG. 13 can be disposed in the electronic apparatus to control the pressure of the first containing space S1 in the box body 122 in a more effective manner.

In summary, in the disclosure, by actively driving the fluid in the box body to flow outside the box body through the pressure adjusting module, the pressure in the box body can be reduced to be less than an external pressure effectively, so the box body turns to be in a negative pressure state, thereby preventing the gaseous heat dissipation medium in the box body from escaping to the outside environment because of high pressure.

What is claimed is:

1. An immersion cooling system, comprising:
   a box body comprising a first containing space, wherein the first containing space is adapted to contain a heat dissipation medium and is configured to be adjustable to a negative pressure state, and at least one heat generating component is disposed in the first containing space to be immersed in the heat dissipation medium which is in liquid state;
   a condensing structure disposed in the first containing space and above the heat dissipation medium which is in a liquid state, the condensing structure comprises a heat exchanger; and
   a pressure adjusting module comprising a second containing space, wherein the second containing space interconnects with the first containing space, and the pressure adjusting module is configured to actively drive a fluid in the first containing space to flow into the second containing space to adjust the first containing space to the negative pressure state,
   wherein the pressure adjusting module is configured to actively drive the fluid in gas state in the second containing space to flow into the first containing space,
   wherein the pressure adjusting module comprises a bellows structure and a driving unit, the driving unit comprises a motor or a cylinder, the second containing space is an expandable and contractible space of the bellows structure, and the driving unit is configured to drive the expandable and contractible space to expand and drive gas in the first containing space to flow into the expandable and contractible space.

2. The immersion cooling system of claim 1, wherein the fluid is gas in the first containing space.

3. The immersion cooling system of claim 1, wherein the driving unit is adapted to drive the expandable and contractible space to contract and drive gas in the expandable and contractible space to flow into the first containing space.

4. An electronic apparatus, comprising:
   at least one heat generating component; and
   an immersion cooling system, comprising:
   a box body comprising a first containing space, wherein the first containing space is adapted to contain a heat dissipation medium and is configured to be adjustable to a negative pressure state, and at least one heat generating component is disposed in the first containing space to be immersed in the heat dissipation medium which is in liquid state;
   a condensing structure disposed in the first containing space and above the heat dissipation medium which is in a liquid state, the condensing structure comprises a heat exchanger; and
   a pressure adjusting module comprising a second containing space, wherein the second containing space interconnects with the first containing space, and the pressure adjusting module is configured to actively drive a fluid in the first containing space to flow into the second containing space to adjust the first containing space to the negative pressure state,
   wherein the pressure adjusting module is configured to actively drive the fluid in gas state in the second containing space to flow into the first containing space,
   wherein the pressure adjusting module comprises a bellows structure and a driving unit, the driving unit comprises a motor or a cylinder, the second containing space is an expandable and contractible space of the bellows structure, and the driving unit is configured to drive the expandable and contractible space to expand and drive gas in the first containing space to flow into the expandable and contractible space.

5. The electronic apparatus of claim 4, wherein the fluid is gas in the first containing space.

6. The electronic apparatus of claim 4, wherein the driving unit is adapted to drive the expandable and contractible space to contract and drive gas in the expandable and contractible space to flow into the first containing space.

* * * * *